(12) United States Patent
DeGroot et al.

(10) Patent No.: US 9,147,788 B2
(45) Date of Patent: Sep. 29, 2015

(54) PHOTOVOLTAIC CELL ASSEMBLY (75) Inventors: Marty DeGroot, Midland, MI (US); Marc Guy Langlois, Midland, MI (US)

(73) Assignee: DOW GLOBAL TECHNOLOGIES LLC, Midland, MI (US)

(*) Notice: Subject to any disclaimer, the term of this patent is extended or adjusted under 35 U.S.C. 154(b) by 287 days.

(21) Appl. No.: 13/819,966

(22) PCT Filed: Aug. 29, 2011

(86) PCT No.: PCT/US2011/049485
§ 371 (c)(1),
(2), (4) Date: Feb. 28, 2013

(87) PCT Pub. No.: WO2012/033657
PCT Pub. Date: Mar. 15, 2012

(65) Prior Publication Data
US 2013/0152996 A1    Jun. 20, 2013

Related U.S. Application Data (60) Provisional application No. 61/380,457, filed on Sep. 7, 2010.

(51) Int. Cl.
*H01L 31/042* (2014.01)
*H01L 31/05* (2014.01)
(Continued)

(52) U.S. Cl.
CPC ............ *H01L 31/0508* (2013.01); *H01L 31/18* (2013.01); *H02S 20/25* (2014.12); *H02S 40/36* (2014.12); *Y02B 10/12* (2013.01); *Y02E 10/50* (2013.01)

(58) Field of Classification Search
USPC ......................................................... 136/244
See application file for complete search history.

(56) References Cited

U.S. PATENT DOCUMENTS 3,459,597 A * 8/1969 Baron ........................... 136/244
3,553,030 A    1/1971 LeBraun
(Continued)

FOREIGN PATENT DOCUMENTS

EP    0769818 A2    4/1997
EP    0841706 A2    5/1998
(Continued)

OTHER PUBLICATIONS

Written Opinion and Search Report for PCT/US2011/049485 mailed Sep. 24, 2012.
(Continued)

*Primary Examiner* — Devina Pillay
(74) *Attorney, Agent, or Firm* — The Dobrusin Law Firm, P.C.

(57) ABSTRACT

The present invention is premised upon an improved photovoltaic cell assembly that include at least plurality of photovoltaic cells with a photoactive portion with a top surface, a top collection structure on the top surface and an opposing conductive substrate layer on a side of the photoactive portion opposite the top surface. Also including a first conductive element with a first surface and wherein the first conductive element is bent at least once and wherein the first surface is in contact with the top collection structure and/or the top surface of a first photovoltaic cell and the opposing conductive substrate layer of an adjacent second photovoltaic cell; further wherein at least a portion of the first surface is held in contact to the cells by an adhesive.

19 Claims, 6 Drawing Sheets

(51) Int. Cl.
*H01L 31/18* (2006.01)
*H02S 20/25* (2014.01)
*H02S 40/36* (2014.01)

(56) References Cited

U.S. PATENT DOCUMENTS

| | | |
|---|---|---|
| 3,767,471 A | 10/1973 | Kasper et al. |
| 4,465,575 A | 8/1984 | Love et al. |
| 4,617,421 A * | 10/1986 | Nath et al. .................. 136/244 |
| 5,391,235 A | 2/1995 | Inoue |
| 6,331,673 B1 | 12/2001 | Kataoya et al. |
| 6,936,761 B2 | 8/2005 | Pichler |
| 7,022,910 B2 | 4/2006 | Gaudiana et al. |
| 7,432,438 B2 | 10/2008 | Rubin et al. |
| 2005/0011550 A1 | 1/2005 | Chittibabu et al. |
| 2005/0257823 A1 | 11/2005 | Zwanenburg |
| 2007/0251570 A1 | 11/2007 | Eckert et al. |
| 2007/0256734 A1 | 11/2007 | Guha et al. |
| 2009/0025788 A1 | 1/2009 | Rubin et al. |
| 2009/0255565 A1 | 10/2009 | Britt et al. |
| 2010/0043863 A1 * | 2/2010 | Wudu et al. .................. 136/244 |
| 2010/0218799 A1 | 9/2010 | Stefani |
| 2011/0091707 A1 | 4/2011 | Jousett et al. |
| 2011/0214735 A1 * | 9/2011 | Mahoney et al. ............. 136/256 |

FOREIGN PATENT DOCUMENTS

| | | |
|---|---|---|
| EP | 1032051 A2 | 8/2000 |
| EP | 1868250 A2 | 12/2007 |
| FR | 2930556 A1 | 10/2009 |
| JP | 2216874 A | 2/1989 |
| JP | 2143468 A | 6/1990 |
| JP | 5-67017 U | 9/1993 |
| JP | 6-21501 A | 1/1994 |
| JP | 10189924 A | 7/1998 |

OTHER PUBLICATIONS

Japanese Office action dated Jan. 30, 2014: Application No. 2013-527151.

* cited by examiner

PHOTOVOLTAIC CELL ASSEMBLY

CLAIM OF PRIORITY

The present application claims the benefit of the filing date of U.S. Provisional Application No. 61/380,457 (filed 7 Sep. 2010) the contents of which are hereby incorporated by reference in their entirety.

FIELD OF THE INVENTION

The present invention relates to an improved photovoltaic (PV) cell assembly, more particularly to an improved photovoltaic cell assembly that interconnects a plurality of cells using a conductive element folded or bent to connect the bottom conductive substrate to the top conductive features of an adjacent cell.

BACKGROUND

Thin film solar cells provide several advantages especially when used in building integrated photovoltaic applications—i.e. devices that are integrated into building structures for example as roofing shingles or exterior wall coverings. One such advantage is that these compositions have a high cross-section for absorbing incident light. That is, photovoltaic layers that are very thin can absorb and convert to electricity a relatively high percentage of incident light. For example, in many thin film solar cell devices, photovoltaic layers may have a thickness in the range of from about 1 µm to about 4 µm. These thin layers allow devices incorporating these layers to be flexible.

The conventional approach to assembly of photovoltaic cells is the so-called string & tab method, in which solar cells are connected to each other using tin or solder coated flat wire (buss) ribbons and bonded by soldering and/or other adhesive material such as conductive epoxy. The wire ribbon is typically bonded to buss bar locations on a conductive grid that is applied to the surface of the cell. It is believed that the cross section of the wire may be limited such that thicker wires are too stiff and thin and wide wires obscure too much light. The net result is that interconnect resistance losses as well as the amount of active cell surface area that is blocked by the ribbon can account for significant reduction in photovoltaic cell assembly (hence the PV device) performance. The string and tab process is particularly suited for use in photovoltaic applications, wherein the photovoltaic cells are rigid. This process may be difficult to use with thin film solar cells because the resulting series string of cells may be fragile and susceptible to lost contact of the PV ribbon with the solar cell. Furthermore, the appearance of the large buss ribbons on the surface of the PV device may be aesthetically undesirable to customers.

One approach to interconnecting thin film solar cells is the so-called "shingling" method, wherein the bottom conductive surface of one solar cell contacts the top surface of an adjacent cell. Again, this process may result in solar cell interconnects that are susceptible to lost contact between the devices.

Among the literature that can pertain to this technology include the following patent documents: U.S. Pat. No. 6,936,761; U.S. Pat. No. 7,022,910; U.S. Pat. No. 7,432,438; U.S. Publications 2007/0251570; 2009/00025788; and 2009/0255565, all incorporated herein by reference for all purposes.

SUMMARY OF THE INVENTION

The present invention is directed to an improved photovoltaic cell assembly that addresses at least one or more of the issues described in the above paragraphs.

It is believed that one potential benefit of the present invention over the prior art is that the inventive photovoltaic cell assembly is constructed and configured in such a way that the horizontal planes of the solar cells need not be substantially coplanar in order to maintain electrical connection between the photovoltaic cells. This provides additional degrees of freedom with respect to the flexibility of the module, in addition to the flexibility provided by the flexible solar cells. The additional flexibility is provided by a conductive interconnect element that is folded (or bent) at least once, preferably about the longitudinal axis (i.e. axis parallel to longest dimension). It is contemplated that the fold (or folds) may be located not in the center of the conductive interconnect element and/or along its longitudinal axis, just so long as it is folded at least one time. The photovoltaic cell assembly described herein also lacks large buss ribbons that obstruct light from entering the cell. The absence of the buss ribbons also may render the PV device aesthetically more appealing versus conventional products prepared using the string and tab approach. Furthermore, the use of this approach may reduce the amount of silver conductive ink in grid application via elimination of large silver buss bars that are generally applied for photovoltaic cell assemblies prepared using string and tab approach. It is contemplated that the cell string can be encapsulated in a polymer laminate after the application of conductive elements. A further advantage contemplated may be improved resistance to thermal cycling and damp heat treatment over adhesive or soldered connections that may be susceptible to degradation under these types of environmental stress.

Accordingly, pursuant to one aspect of the present invention, there is contemplated a photovoltaic cell assembly that includes at least a plurality of photovoltaic cells, the cells including at least a photoactive portion with a top surface, a top collection structure on the top surface and an opposing conductive substrate layer on a side of the photoactive portion opposite the top surface; a first conductive element with a first surface and wherein the first conductive element is bent at least once; the first surface is in contact with the top collection structure and/or the top surface of a first photovoltaic cell and the opposing conductive substrate layer of an adjacent second photovoltaic cell; further wherein at least a portion of the first surface is held in contact to the cells by an adhesive.

The invention may be further characterized by one or any combination of the features described herein, such as the plurality of photovoltaic cells each further include a leading edge and a trailing edge, wherein the conductive element contacts the first photovoltaic cell at the trailing edge and the conductive element contacts the opposing conductive substrate layer of the adjacent second photovoltaic cell at the leading edge; the leading edge of the adjacent second photovoltaic cell overlaps the trailing edge of the first photovoltaic cell; the top collection structure comprises a series of spaced apart conductive traces of a material with lower sheet resistance than the top surface; the top collection structure comprises at least one buss line; at least a portion of a peripheral edge portion of the cells include a non-conductive layer portion; the non-conductive layer portion comprises either a liquid dielectric that is cured via UV radiation or a non-conductive tape; the conductive element is an electrically conductive adhesive tape; the conductive element is a foil tape with an embossed surface and wherein at least 10% of the surface area of the embossed surface is in direct contact with the cell; the adhesive is a conductive adhesive; the adhesive is a non-conductive adhesive; the at least one bend forms an angle α is between 0° and 90°; an overlap of the conductive element on the conductive substrate layer is at least 2.0 mm in length; an overlap of the conductive element overlaps at least about 10% of an area of the buss line; the conductive element includes a plurality of folds.

Accordingly, pursuant to another aspect of the present invention, there is contemplated a method of manufacturing a photovoltaic assembly, including the steps of: (a) providing at least two solar cells, the solar cells including a photoactive portion with a top surface, a top collection structure, and a bottom conductive substrate, further wherein the cell includes a leading edge and a trailing edge; (b) providing a at least one conductive element, each with a first surface; (c) providing at least one terminal bar; (d) placing a first cell such that a bottom surface of the conductive substrate near the leading edge of a first of the plurality of solar cells contacts a first terminal bar; (e) connecting a first terminal bar to the first cell using a conductive component; (f) folding a first conductive element at least once about an axis; (g) applying the folded conductive element to the top of the first cell near the trailing edge and precisely placed such that the conductive element contacts the top surface of the solar cell and/or the top collection structure; and (h) placing a second cell on the folded conductive element that has already been applied to the first solar cell such that a bottom surface of the conductive substrate of the second solar cell contacts the folded conductive element, thus producing a string having a first cell and an end cell; (i) optionally folding an additional conductive element at least once about an axis, applying the additional folded conductive element to the top of the end cell near the trailing edge and precisely placed such that the conductive element contacts the top surface of the solar cell and/or the top collection structure; and placing an additional cell on the folded conductive element that has already been applied to the end solar cell such that a bottom surface of the conductive substrate of the additional solar cell contacts the folded conductive element, to form a string with a first cell and at least one intermediate cell and an end cell, wherein the previous end cell becomes an intermediate cell; (j) optionally repeating step (i); (k) placing a second terminal bar such that it contacts the top surface of the last of the end solar cell on a buss line that is part of the collection structure edge of the end solar cell; (l) connecting the second terminal bar to the last cell using a conductive component.

It should be appreciated that the above referenced aspects and examples are non-limiting, as others exist within the present invention as shown and described herein.

DETAILED DESCRIPTION OF THE PREFERRED EMBODIMENT

Figure 5:
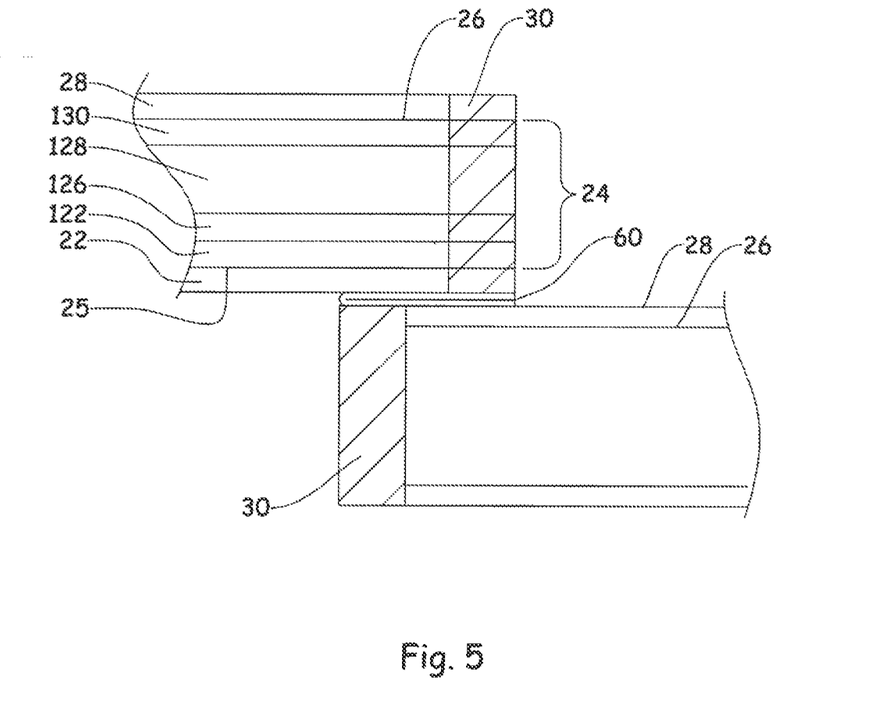
FIG. 5 is a more detailed side view of FIG. 4, illustrating example layers.
Figure 6:
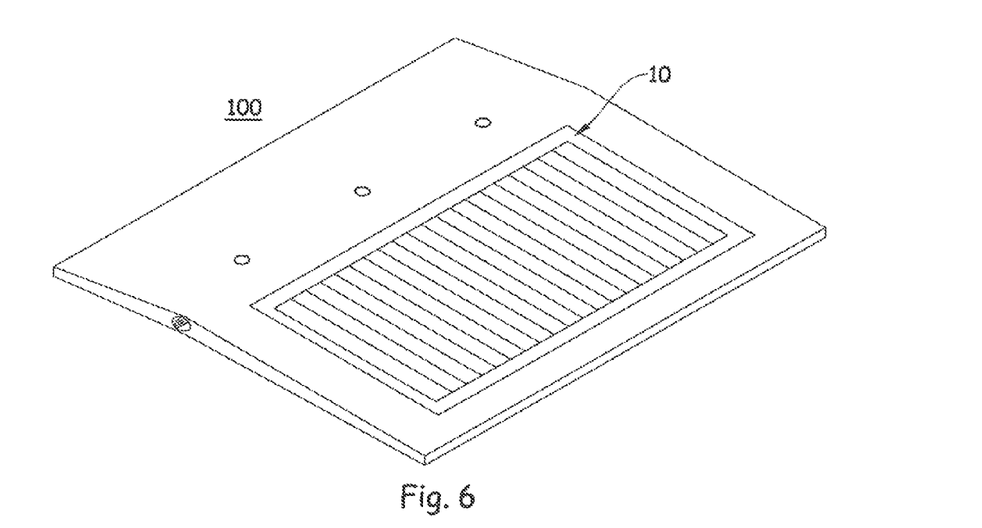
FIG. 6 is a top perspective view of a PV device with a 4-cell photovoltaic cell assembly included therein.
Figure 7A:
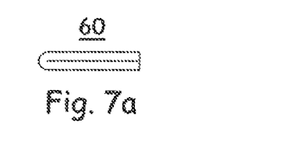
FIGS. 7A-7D are side views of exemplary banded conductive elements.
Figure 7B:
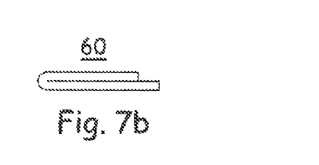
Figure 7C:
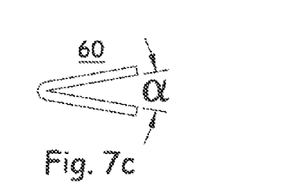
Figure 7D:
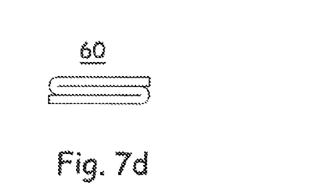
Figure 7E:
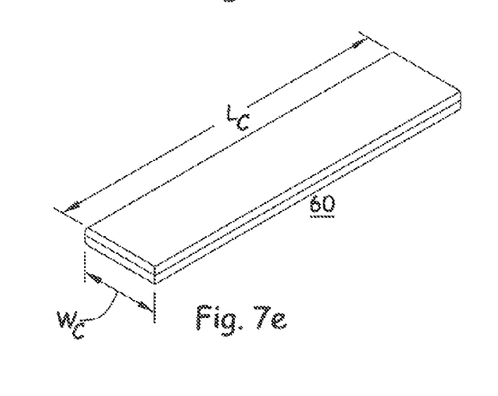
FIGS. 7E-F are top perspective views of a two conductive elements, one with a length longer than its width and one with a width longer than its length.
Figure 7F:
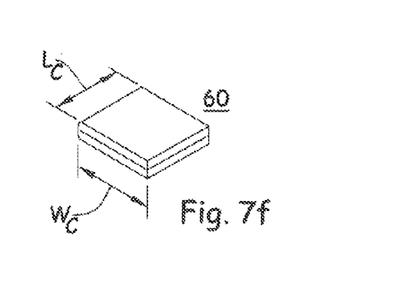

The present invention relates to an improved photovoltaic cell assembly 10, as illustrated in FIGS. 1-5, and can be described generally as an assembly of a number of components and component assemblies that functions to provide electrical energy when subjected to solar radiation (e.g. sunlight). In one example, the improved photovoltaic cell assembly 10 may be incorporated into a larger photovoltaic device, for example a solar shingle 100 as shown in FIG. 6.

Of particular interest and the main focus of the present disclosure is an improved photovoltaic cell assembly 10 that includes at least a plurality of photovoltaic cells 20, and a conductive element 60, and optionally first and second encapsulant layers 40, 50. The conductive element 60 is folded or bent at least once and connects the conductive substrate 22 of one cell to the top conductive feature(s) 26 and/or 28 of an adjacent cell. In a preferred embodiment, the conductive element 60 is folded at least once along its longest dimension (e.g. along its length $L_C$). However, in some embodiments, e.g. if the fold is more than once or an accordion fold, the fold may be along a different dimension (e.g. as illustrated in FIGS. 7A-F). Generally, the plurality of photovoltaic cells may be constructed of a plurality as of layers. These layers can be further defined (e.g. from the bottom up) to include at least: a conductive substrate layer 22; a photoactive layer 24; and a top electrical collection structure 28. It is also preferred that at least along a portion of the peripheral edge of the cells a non-conductive layer portion 30 is included, for example as illustrated in FIG. 5. Additionally, the assembly 10 is configured such that a first surface of the conductive element 60 is in contact with both the top electrical collection structure 28 of a first photovoltaic cell and the opposing conductive substrate layer 22 of an adjacent photovoltaic cell when the conductive element 60 is folded at least once.

It is contemplated that the relationships (e.g. at least the geometric properties and the material properties) between the components and component assemblies are surprisingly important in solving one or more the issues discussed in the background section above. Each of the components and component assemblies and their relationships are disclosed in greater detail and specificity in the following paragraphs.

Conductive Substrate Layer 22

The conductive substrate layer 22 functions similarly to the top conductive layer 24, in that it conducts the electrical energy produced by the photoactive portion. The conductive substrate layer 22 may be rigid or flexible, but desirably is flexible, particularly in those embodiments in which the resultant photovoltaic device may be used in combination with non-flat surfaces. The conductive substrate layer can be a single integral layer or can be formed from one or more layers formed from a wide range of materials, including metals, metal alloys, intermetallic compositions, and/or combinations of these. For applications wherein a flexible substrate layer is desired, layer 22 is typically a metal foil. Examples include metal foil comprising Cu, Al, Ti, Mo or stainless steel. Typically, this conductive substrate layer is formed of a stainless steel and the photoactive portion 24 is formed above the substrate layer, although other configurations are contemplated and do not necessarily effect the concepts of cell interconnect presented herein. In illustrative embodiments, stainless steel is preferred.

The conductive substrate layer 22 can be coated on one or both sides with a wide range of electrically conductive materials, including one or more of Cu, Mo, Ag, Al, Cr, Ni, Ti, Ta, Nb, W and/or combinations of these. Conductive compositions incorporating Mo may be used in an illustrative embodiment. A back contact layer 122 formed on the conductive substrate layer proximal to the photoactive layer helps to isolate the photoactive layer 24 from the support to minimize migration of support constituents into the photoactive layer. For example, the back contact layer 22 can help to block the migration of Fe and Ni constituents of a stainless steel support into the photoactive layer 24. Conductive metal layers formed on one or both sides of the conductive substrate layer 22 can also can protect the substrate layer against degradation that could be caused during formation of the photoactive layer 24, for instance by protecting against S or Se if these are used in the formation of photoactive region 24.

Photoactive Portion 24

The photoactive layer or portion 24 of the photovoltaic cell 20 contains the material which converts light energy to electrical energy. Any material known to provide that function may be used including amorphous silicon, CdTe, GaAs, dye-sensitized solar cells (so-called Graetzel cells), organic/polymer solar cells, or any other material that converts sunlight into electricity via the photoelectric effect. However, the photoactive cell is preferably a IB-IIIA-chalcogenide-based cell, such as IB-IIIA-selenides, IB-IIIA-sulfides, or IB-IIIA-selenide sulfides (i.e. absorber layer is a IB-IIIA chalcogenide, preferably a copper chalcogenide). More specific examples include copper indium selenides, copper indium gallium selenides, copper gallium selenides, copper indium sulfides, copper indium gallium sulfides, copper gallium selenides, copper indium sulfide selenides, copper gallium sulfide selenides, and copper indium gallium sulfide selenides (all of which are referred to herein as CIGS). These can also be represented by the formula $CuIn_{(1-x)}Ga_xSe_{(2-y)}S_y$, where x is 0 to 1 and y is 0 to 2. The copper indium selenides and copper indium gallium selenides are preferred. The portion 24 may comprise multiple layers in addition to the absorber layer such as one or more of emitter (buffer) layers, conductive layers (e.g. transparent conductive layers) and the like as is known in the art to be useful in CIGS based cells are also contemplated herein. These cells may be flexible or rigid and come in a variety of shapes and sizes, but generally are fragile and subject to environmental degradation. In a preferred embodiment, the photovoltaic cell 20 is a cell that can bend without substantial cracking and/or without significant loss of functionality. Exemplary photovoltaic cells are taught and described in a number of US patents and publications, including U.S. Pat. No. 3,767,471, U.S. Pat. No. 4,465,576, US20050011550 A1, EP641706 A2, US20070256734 a1, EP1032051A2, JP2216874, JP2143468, and JP10189924a, incorporated hereto by reference for all purposes.

In a exemplary embodiment, the photoactive layer 24 may be further constructed of any number of layers, for example: a back contact layer 122 (typically Mo); an absorber layer 124 (typically CuInGaSe(S)); a buffer layer 126 (typically CdS); a window layer 128 (typically ZnO); and transparent conductive layer 130 (typically indium tin oxide (ITO or aluminum zinc oxide (AZO)). It is believed that cells 20 of this configuration are typically known as "CIGS solar cells", see FIG. 5A-A.

It is contemplated that the photovoltaic cells 20 may be formed from other known solar cell technology. Examples of these include amorphous silicon or cadmium telluride based solar cell devices. Additionally, components within the photovoltaic cells 20 as described above can be substituted for alternative materials. For example, the buffer layer 126 can be for sulfides, selenides or oxides of Cd, Zn, In, Sn and combinations thereof; An optional window layer compromised of a resistive transparent oxide of for example Zn, Cd, In, Sn may be included between the buffer region 126 and the transparent conductive layer 130. Preferably, the window layer is intrinsic zinc oxide.

The transparent conductive layer 130 may be situated as the top layer of the photoactive layer 24. A wide variety of transparent conducting oxides or combinations of these may be incorporated into the transparent conductive layer. In typical embodiments, the transparent conductive layer 130 is a transparent conductive oxide (TCO), with representative examples including fluorine-doped tin oxide, tin oxide, indium oxide, indium tin oxide (ITO), aluminum doped zinc oxide AZO), zinc oxide, combinations of these, and the like. In one illustrative embodiment, the transparent conductive layer is indium tin oxide. Transparent conductive layers may be conveniently formed via sputtering or other suitable deposition technique.

It is contemplated that in certain photovoltaic cells 20, a distinctive transparent conductive layer 130 may not be required. For example GaAs type cells typically do not require a transparent conductor as the GaAs layer may be sufficiently conductive. For the sake of the present invention, then the layer that is immediately below the collection structure 28 should be considered the top surface 26 of the cell 20.

These substitutions are known to those in the art and does not affect the concept of cell interconnect presented herein.

Top Collection Structure 28

Figure 1:
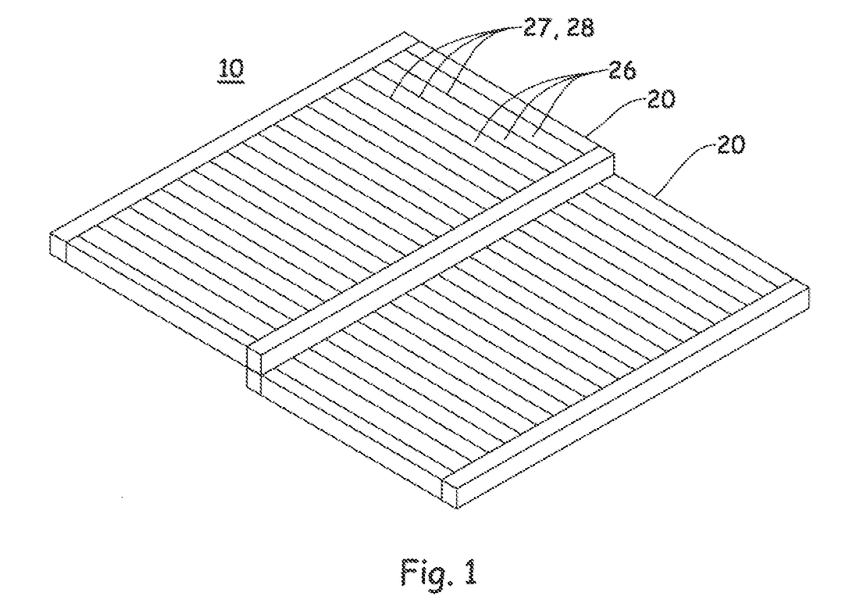
FIG. 1 is a top perspective view of one illustrative example of the present invention.
Figure 1A:
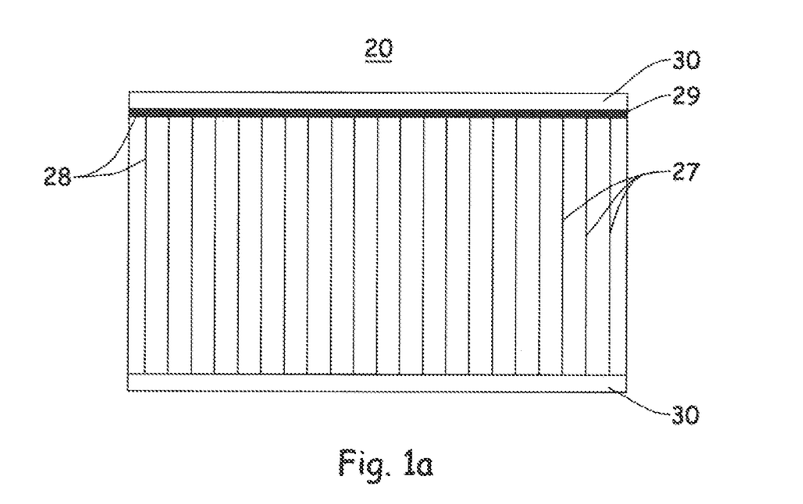
FIG. 1A is a plan view of the lower cell of FIG. 1 including an exemplary buss line.
Figure 9:
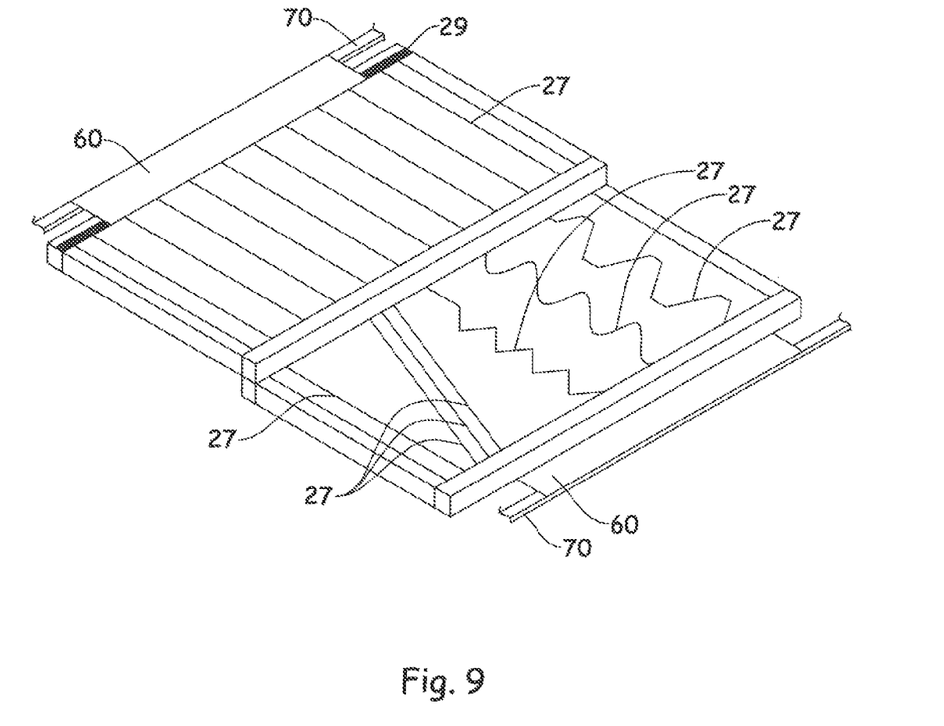
FIG. 9 is a top perspective view of one illustrative example of the present invention with a terminal bar and alternatively configured traces.

The top collection structure 28 functions to collect the electrical energy produced by the photoactive portion 22 and focus it into conductive paths. The collection structure 28 may be deposited over the photoactive layer 24 (e.g. on the top surface 26) to reduce the effective sheet resistance of the top surface layer of the cell (e.g. TCO layer 130). The collection structure 28 typically may comprise optically opaque materials and may be applied as a series of substantially parallel conductive traces 27 (although other configurations are contemplated and do not necessarily effect the concept of cell interconnect presented herein, for example as shown in FIG. 9) with spaces between the traces so that the grid occupies a relatively small footprint on the surface. One exemplary additional collection structure 28 configuration is illustrated in FIG. 1A, where the structure 28 includes a buss line 29 which is generally runs perpendicular to the other conductive traces 27 shown. In one preferred embodiment, the buss line 29 may be located near (e.g. within about 10.0 mm) the peripheral edge of the cell 20 at the trailing edge 34. More preferably it is located immediately adjacent the non-conductive layer portion 30.

For example, in some embodiments, the collection structure occupies about 5% or less, even about 2% or less, or even about 1% or less of the total surface area associated with light capture to allow the photoactive materials to be exposed to incident light. The collection structure 28 preferably includes conductive metals such as Ag, Al, Cu, Cr, Ni, Ti, Ta, and/or combinations thereof. In one illustrative embodiment, the grid has a dual layer construction comprising nickel and silver. The collection structure can be formed by a variety of techniques including screen-printing, ink-jet printing, electroplating, and metallization through a shadow mask using physical vapor deposition techniques such as evaporation or sputtering.

Non-Conductive Layer Portion 30

The non-conductive layer portion 30 functions as an insulator or a dielectric that electrically isolates the conductive elements 60 from the edges of the solar cells. It is contemplated that the presence of the non-conductive layer portion reduces the occurrence of electrical shorts at the edge of the solar cell that may be caused by contact with the conductive elements 60. The insulator can be applied to the solar cell or to the conductive elements 50 at one or both of the leading or trailing edges 32, 34 of each individual solar cell in the solar cell assembly. The insulator can be formed as discrete regions along the edge of the device at the locations where the conductive elements cross the edge of the solar cell, or it can be applied as a single layer along the entire length or a substantial portion of the edge of the cell 20, so that it may comprise a discrete layer between the cell and the conductive elements 60. The insulator may be of a type of synthetic polymer that can be deposited as a liquid and cured or cross-linked to form a solid material. Curing or cross-linking can be achieved via the application of thermal or ultraviolet (UV) energy, for example. For UV-curable compositions, it is desirable that the curing process can be carried out in a short timeframe, such as less than 10 seconds, and more specifically can be less than about 3 seconds. Many photocurable polymers require energy of at least 300 mJ/cm$^2$ and more typically about 500-1200 mJ/cm$^2$ of UV energy in the 200-400 nm range. Exemplary embodiments include acrylate and epoxy resin based compositions. Alternatively, the non-conductive layer portion 30 can be applied as a solid material, such as in tape form. Suitable alternatives may include fluorocarbon polymers, such as ethylene tetrafluoroethylene (ETFE), curable insulating polymers that can be coated on the cell or interconnect material or inorganic dielectric material that can be applied to the solar cell or interconnect material. It is contemplated that it could also be substituted for the material used as the encapsulant layers 40, 50, such as polyethylene film. In a preferred embodiment, the non-conductive layer portion 30 is a liquid dielectric epoxy composition that is cured via UV radiation. In one illustrative embodiment, the portion 30 is a polyimide tape. One such commercially available tape is Kapton® tape offered by Dupont®. In general, the non-conductive layer portion 30 can exhibit a dielectric constant greater than about 2 and can be even greater than about 4. Exemplary electrically insulating materials have a dielectric constant greater than about 4.8 and volume resistivity greater than about $3 \times 10^{14}$ Ω-cm.

Conductive Element 60

The conductive element, 60 functions as an electrical bridge between photovoltaic cells 20. It is contemplated in the present invention that, the electrical bridge is formed between the top of one cell (e.g. collection structure 28 and/or top surface 26) and the conductive substrate layer 22 of an adjoining cell. It is desirable that this element have a relatively low electrical resistance (preferably less than about 1.0 Ω/m more preferably less than about 0.20 Ω/m, most preferably less than 0.05 Ω/m). They may be in the form of electrically conductive foils or conductive adhesive tape, or any like structure that performs the above bridging function. Illustrative conductive elements metal foils comprising Cu or Al and can be plated with Ag, Sn or Ni. According to one embodiment, an adhesive can be applied to the metal foil to provide a means to attach the foil to the top and bottom surfaces of the solar cell. It is contemplated that the metal foil tape may comprise an adhesive that can be conductive or non-conductive. An example of commercially available metal foil tapes include EMI shielding tapes provided by 3M®. In exemplary embodiments, the metal foil tape comprises a non-conductive acrylic adhesive.

Figure 2:
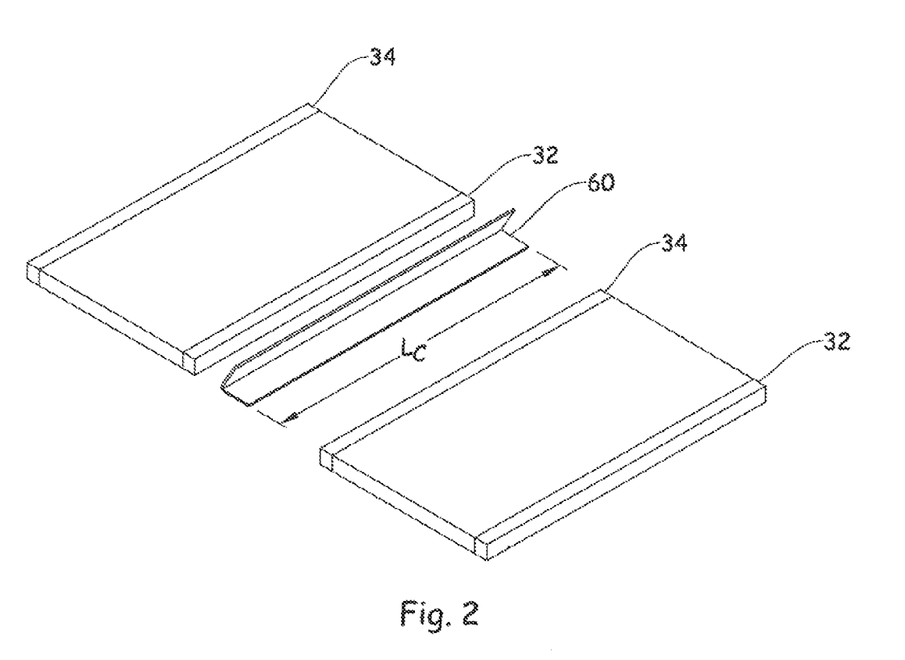
FIG. 2 is a exploded view of the example shown in FIG. 1.
Figure 3:
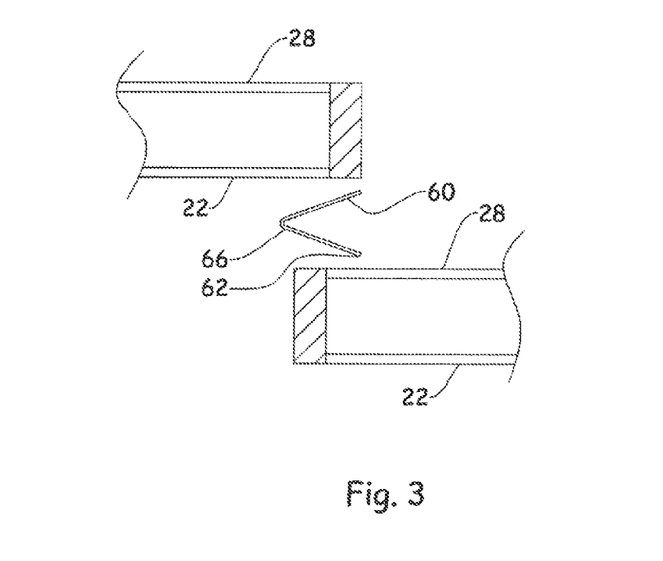
FIG. 3 is a more detailed side view of the example shown in FIG. 2.
Figure 4:
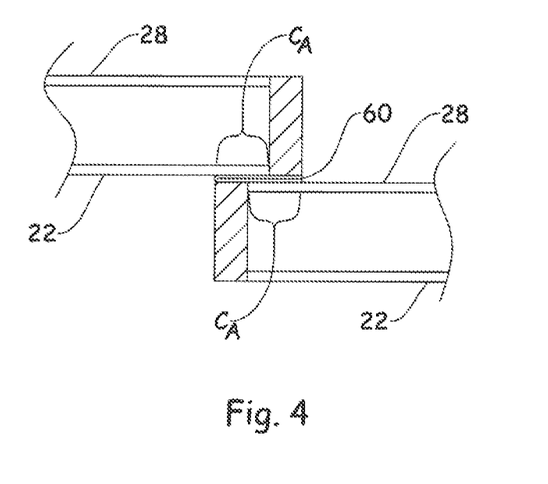
FIG. 4 is a more detailed side view of the example shown in FIG. 1.

In preferred embodiments, the conductive element 60 is applied along the area of the trailing edge 34 of a first photovoltaic cell contacting the collection structure 28 and the top surface 26 of the photovoltaic cell at the area of the leading edge 32. It is contemplated that the length ($L_C$) of conductive element 60 across the trailing edge 34 of the individual cell may vary from as little as 50% the length of the cell to as much as spanning the entire length, as illustrated in FIG. 2. The length of the conductive element 60 is typically 50-100% of the length of the trailing edge, preferably 75-100% of the length of the trailing edge 34 and even more preferably 85-95% of the length of the trailing edge 34. Preferably, the conductive element contacts at least a portion of the buss line 29 of the collection structure 28. In an exemplary embodiment, the buss line 29 and the conductive element 60 are approximately the same length.

It is contemplated that the width ($W_c$) conductive element 60 should be of a size to provide sufficient contact between the element 60 and the conductive substrate layer 22 and the collection structure 28 and the top surface 26 to meet the resistivity requirements (e.g. less than about 1.0Ω more preferably less than about 0.2Ω, even more preferably less than about 0.05Ω). In one preferred embodiment, the overlap "$C_A$", at least as to the conductive substrate layer 22, ranges from about 2.0 mm to 50.0 mm, more preferably from about 5.0 mm to 50.0 mm, and most preferably from about 10.0 mm to 25.0 mm. In another preferred embodiment, the overlap "$C_A$", at least as to the collection structure 28 and the top surface 26, ranges from about 2.0 mm to 20.0 mm, more preferably from about 2.0 mm to 15.0 mm, and most preferably from about 2.0 mm to 10.0 mm. In yet another preferred embodiment, at least as to the collection structure 28 where a buss line 29 is present, the overlap "$C_A$", may overlap at least about 10% of the area of the buss line 29, more preferably about 50%, and most preferably about 100%.

It is contemplated that the outside surface (first surface) 66 of the conductive element includes an adhesive that allows the conductive element 60 to adhere to the cell 20, although the adhesive may be on the cell in place of or in addition to the adhesive on the element 60. When the conductive element is a metal foil, conductive adhesive elements such as conductive epoxy or solder can be applied to adhere the metal foil to the top and bottom surfaces of the solar cells. In preferred embodiments, the conductive adhesive comprises at least an epoxy resin (typically a bisphenol based epoxy resin) a curing agent and conductive metal particles. The conductive metal particles are preferably silver or copper particles and preferably comprise at least 30%, more preferably at least 50% of the composition of the conductive adhesive by weight. When the conductive element is a conductive metal foil tape, the adhesive can be a conductive or non-conductive adhesive. For a metal foil tape with a conductive adhesive, the adhesive portion may comprise an organic (non-conductive) adhesive component and conductive particles. In exemplary embodiments, the conductive adhesive may be an acrylic adhesive or a conductive epoxy. For a metal foil tape with a non-conductive adhesive, the metal foil may have an embossed surface that allows direct electrical contact of portions of the metal foil with the top and bottom surfaces of the solar cells, and regions wherein the non-conductive adhesive contacts the top and bottom surfaces of the solar cells. In preferred embodiments, at least 10% of the surface area of the embossed surface of the metal foil is in direct electrical contact with the top and bottom of the solar cell in regions where the metal foil contacts the solar cell. More preferably at least 40% of the surface area is in direct electrical contact with the surfaces of the solar cell. In preferred embodiments, the conductive element 60 is an embossed tin plated copper foil with a pressure sensitive acrylic adhesive.

The thickness of the conductive element 60 should be thick enough to satisfy the resistivity requirements, yet thin enough to enable the material to be folded. In preferred embodiments, the metal foil tape is between 0.01 mm to about 0.15 mm thick, more preferably 0.025 to about 0.05 mm thick.

It is also contemplated that the conductive element 60 may be in multiple pieces (2 or more) so long as the above results are still achieved. Exemplary configurations of the fold (or folds) in the element 60 are illustrated in FIGS. 7A-7F. These are for illustrative purposes and should not be considered as limiting as to all the possible bending configurations.

Figure 8A:
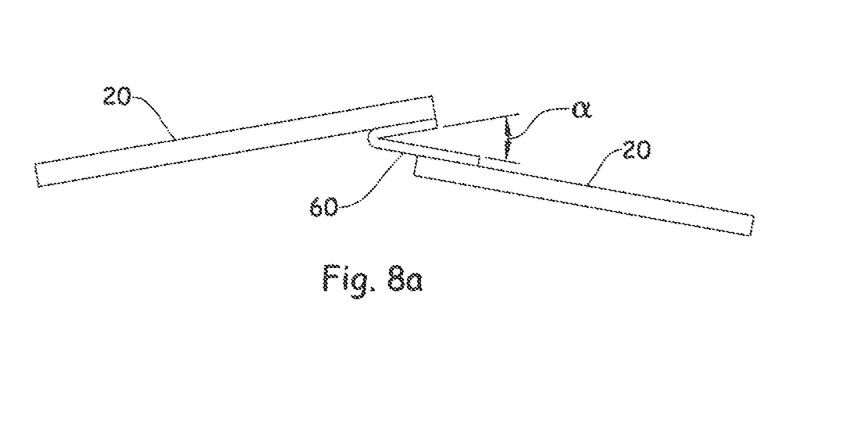
FIGS. 8A-8B are side views illustrating examples of cells that are on different planes.
Figure 8B:
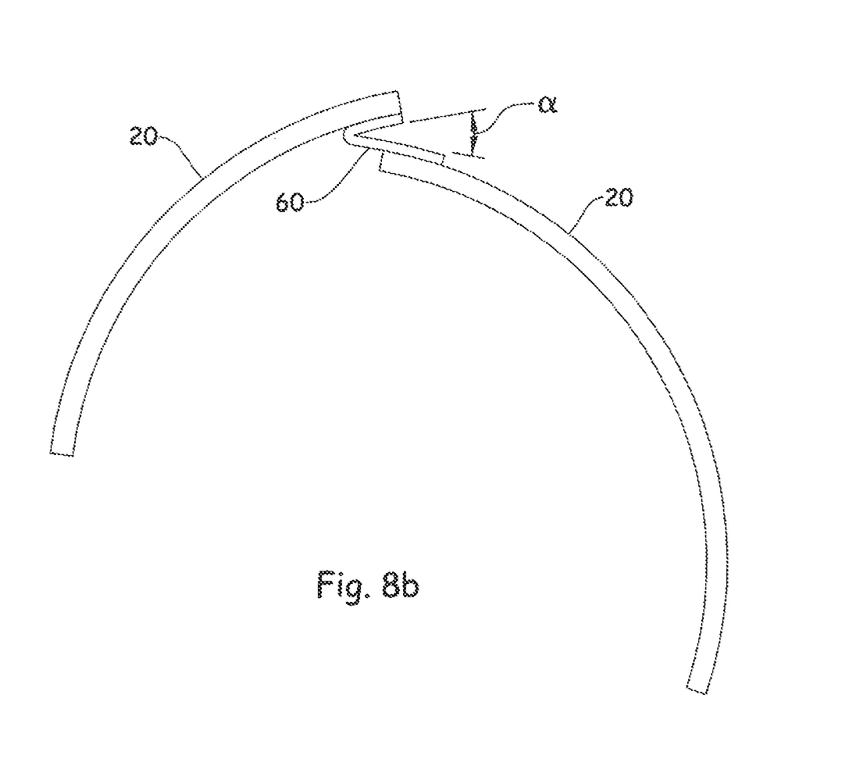

It is also contemplated that the conductive element 60 may not be folded completely upon itself, but maintains some angle α, for example as shown in FIGS. 8A and 8B. In FIG. 8A the cells 20 are disposed on different planes and in FIG. 8B the cells are on a curved surface. It is contemplated that angle α can be as great as 360°s, but it is preferred that it range between about 0° and 90°, more preferably between about 0° and 45, and most preferably between about 0° and 15°.

In another aspect of the invention, it is contemplated that the assembly 10 may also include additional conductive elements 60 that may or may not be bent and function to connect the chain of cells 20 to one or more terminal bars 70, for example as shown in FIG. 9. The terminal bar 70 functions as a conduit for the electrical energy from the assembly 20. It is contemplated that the connection may be created and/or maintained between the element 60 and the terminal bar 70 via adhesive (conductive or non-conductive), welding, soldering, or potentially any other joining technique.

First Encapsulant Layer 40

It is contemplated that the photovoltaic cell assembly may further comprise an optional first encapsulant layer 40 that may perform several functions. For example, the layer 40 may serve as a bonding mechanism, helping hold the adjacent layers together (e.g. the cell 20; conductive element 60; and/or the second encapsulant layer 50). It should also allow the transmission of a desirous amount and type of light energy to reach the photovoltaic cell 20 (e.g. the photoactive portion 24). The first encapsulant layer 40 may also function to compensate for irregularities in geometry of the adjoining layers or translated though those layers (e.g. thickness changes). It also may serve to allow flexure and movement between layers due to environmental factors (e.g. temperature change, humidity, etc.) and physical movement and bending. In a preferred embodiment, first encapsulant layer 40 may consist essentially of an adhesive film or mesh, but is preferably a thermoplastic material such as EVA (ethylene-vinyl-acetate), thermoplastic polyolefin or similar material. It is contemplated that the layer 40 may be comprised of a single layer or may be comprised of multiple layers (e.g. a first, second, third, fourth, fifth layer, etc. The preferred thickness of this layer 40 can range from about 0.1 mm to 1.0 mm, more preferably from about 0.2 mm to 0.8 mm, and most preferably horn about 0.25 mm to 0.5 mm.

It is contemplated that "good" adhesion via adsorption of the encapsulant layers to all surfaces being contacted is important to maintaining the integrity of the encapsulated assembly. As a general guide, adhesion forces measured for adsorption to glass should be greater than about 20 N/15 mm, more preferably greater than about 30 N/15 mm and even more preferably greater than about 40 N/15 mm. The adhesive strength can be determined using a standard 180 degree pull test as described in ASTM D903-98.

Second Encapsulant Layer 50

In another example of an encapsulant layer, an optional second encapsulant layer 50, is generally connectively located below the photovoltaic cell 20, although in some instances, it may directly contact the first encapsulant layer 40. It is contemplated that the second encapsulant layer 50 may serve a similar function as the first encapsulant layer, although it does not necessarily need to transmit electromagnetic radiation or light energy.

Method

It is contemplated that the method of assembling the photovoltaic cells 20 into an assembly 10 is also inventive. It is contemplated that all the components described above are provided and the assembly method utilized to manufacture the assembly 10 include the following. Solar cells 20 can be provided in batches or stacks and manually or automatically provided to an unloading station. The solar cells 20 may alternatively be provided in the form of a continuous roll comprising a plurality of solar cells and separated from the roll just prior to assembly in a step referred to as singulation. The singulated solar cells can be provided in bins that have been sorted by photovoltaic performance. The cells 20 provided in the bins can be manually loaded individually by an operator, or more preferably an industrial robot can be used to pick individual cells from the bins and place in an inspection area. A vision system can then be used to guide an industrial robot in the precision pick-up and placement of the photovoltaic cells 20 onto a flattop vacuum conveyor in the proper orientation. In one embodiment, the vision system includes a camera that takes a picture of the top surface of the cell, which conveys information regarding the exact orientation of the cell to the robot so that the robot can pick it up and place it on the conveyor in a precisely positioned orientation.

The first cell in the solar cell string is placed such that the bottom surface of the conductive substrate 22 near the leading edge 32 of the solar cell 20 contacts a first terminal bar. The first terminal bar is connected to the first solar cell using a conductive adhesive component such as a conductive epoxy or a solder. Alternatively, the first solar cell may be connected to the first terminal bar via conductive element 60, which may be provided in a manner as described below for interconnection of the solar cells. For interconnection of the cells, the conductive elements are folded at least once about an axis. It is contemplated that the conductive element can be provided in a continuous form, such as on a roll and that the folding operation can be carried out using a series of mechanical guides and rollers that fold the conductive element. The folded conductive element can then be cut to the appropriate length using mechanical cutters such as nip shears. The folded conductive element is preferably provided as a metal foil tape. However, if the conductive element 60 is provided as a metal foil, then a conductive adhesive, such as a conductive epoxy must be applied to the top surface of the solar cells 20 on the buss lines on the collection structure 28 prior to placing the conductive element 60.

The folded conductive element is then applied to the top of the first solar cell 20 near the trailing edge 34 and precisely placed such that the conductive element contacts the top surface of the solar cell on a buss line that is part of the collection structure 28 or "grid" on the solar cell surface and is parallel to the trailing edge 34 of the cell. The vacuum conveyor then indexes by the appropriate length, and a second solar cell is placed on the vacuum conveyor precisely such that the bottom surface of the conductive substrate 22 of the second solar cell contacts the folded conductive element 60 that has already been applied to the first solar cell. It is contemplated that the leading edge 32 of the second solar cell overlaps the trailing edge 34 of the first solar cell. The process of applying conductive elements and cells is repeated until the desired string length is completed. After placing the last cell in the string, a second terminal bar may be applied to the top surface of the last cell such that the terminal bar contacts the buss line of the collection structure 28 near the trailing edge 34 of the last cell. The first terminal bar is secured to the first solar cell using a conductive adhesive component such as a conductive epoxy or a solder. In the case of a conductive epoxy, the conductive epoxy should be applied to the buss line of the last cell prior to providing the second terminal bar. Alternatively, the first solar cell may be connected to the first terminal bar via conductive element 60, which may be provided in a manner as described above for interconnection of the solar cells.

Following completion of the interconnected assembly with terminal bars attached at opposing ends, the solar cell string can be placed between the first encapsulant layer 40 and second encapsulant layer 50 The product with first encapsulant layer 40, solar cells 20, plurality of conductive elements 60, terminal bars and second encapsulant layer 50 is laminated, for example in a vacuum laminator, and thus the assembly is complete.

Unless stated otherwise, dimensions and geometries of the various structures depicted herein are not intended to be restrictive of the invention, and other dimensions or geometries are possible. Plural structural components can be provided by a single integrated structure. Alternatively, a single integrated structure might be divided into separate plural components. In addition, while a feature of the present invention may have been described in the context of only one of the illustrated embodiments, such feature may be combined with one or more other features of other embodiments, for any given application. It will also be appreciated from the above that the fabrication of the unique structures herein and the operation thereof also constitute methods in accordance with the present invention.

The preferred embodiment of the present invention has been disclosed. A person of ordinary skill in the art would realize however, that certain modifications would come within the teachings of this invention. Therefore, the following claims should be studied to determine the true scope and content of the invention.

Any numerical values recited in the above application include all values from the lower value to the upper value in increments of one unit provided that there is a separation of at least 2 units between any lower value and any higher value. As an example, if it is stated that the amount of a component or a value of a process variable such as, for example, temperature, pressure, time and the like is, for example, from 1 to 90, preferably from 20 to 80, more preferably from 30 to 70, it is intended that values such as 15 to 85, 22 to 88, 43 to 51, 30 to 32 etc. are expressly enumerated in this specification. For values which are less than one, one unit is considered to be 0.0001, 0.001, 0.01 or 0.1 as appropriate. These are only examples of what is specifically intended and all possible combinations of numerical values between the lowest value and the highest value enumerated are to be considered to be expressly stated in this application in a similar manner.

Unless otherwise stated, all ranges include both endpoints and all numbers between the endpoints. The use of "about" or "approximately" in connection with a range applies to both ends of the range. Thus, "about 20 to 30" is intended to cover "about 20 to about 30", inclusive of at least the specified endpoints.

The disclosures of all articles and references, including patent applications and publications, are incorporated by reference for all purposes.

The term "consisting essentially of" to describe a combination shall include the elements, ingredients, components or steps identified, and such other elements ingredients, components or steps that do not materially affect the basic and novel characteristics of the combination.

The use of the terms "comprising or ° including" describing combinations of elements, ingredients, components or steps herein also contemplates embodiments that consist essentially of the elements, ingredients, components or steps.

Plural elements, ingredients, components or steps can be provided by a single integrated element, ingredient, component or step. Alternatively, a single integrated element, ingredient, component or step might be divided into separate plural elements, ingredients, components or steps. The disclosure of "a" or "one" to describe an element, ingredient, component or step is not intended to foreclose additional elements, ingredients, components or steps. All references herein to elements or metals belonging to a certain Group refer to the Periodic Table of the Elements published and copyrighted by CRC Press, Inc., 1989. Any reference to the Group or Groups shall be to the Group or Groups as reflected in this Periodic Table of the Elements using the IUPAC system for numbering groups.

LIST OF ELEMENT NUMBERS photovoltaic cell assembly 10
photovoltaic cells 20
conductive substrate layer 2
photoactive layer 24
bottom surface 25
top surface 26
conductive traces 27
collection structure 28
buss line 29
non-conductive layer portion 30
conductive element 60
outside surface 66 of the conductive element 60
terminal bar 70
Length $L_C$ of the conductive element
Width $W_C$ of the conductive element
Overlap $C_A$
back contact layer 122
CuInGaSe(S) absorber layer 124
buffer layer 126
window layer 128
transparent conductive layer 130

What is claimed is:

1. A photovoltaic cell assembly comprising:
   a plurality of photovoltaic cells each comprising:
      a photoactive portion with a top surface;
      a top collection structure on the top surface, and
      an opposing conductive substrate layer on a side of the photoactive portion opposite the top surface;
      a conductive foil with a first surface and wherein the conductive foil is folded at least once along its longest dimension forming at least one bend, and wherein the at least one bend forms an angle α from 0° and 45°;
      wherein the first surface is in direct contact with the top collection structure and/or the top surface of a first photovoltaic cell and the opposing conductive substrate layer of an adjacent second photovoltaic cell; further wherein at least a portion of the first surface is held in contact to the cells by an adhesive; and
   wherein the plurality of photovoltaic cells each further include a leading edge and a trailing edge, wherein the conductive foil contacts the first photovoltaic cell at the trailing edge and the conductive foil contacts the opposing conductive substrate layer of the adjacent second photovoltaic cell at the leading edge, further wherein the leading edge of the adjacent second photovoltaic cell overlaps the trailing edge of the first photovoltaic cell and the length of the conductive foil in contact with the trailing edge is from 50 to 100 percent of the length of the trailing edge.

2. The photovoltaic cell assembly according to claim 1, wherein the top collection structure comprises a series of spaced apart conductive traces of a material with lower sheet resistance than the top surface.

3. The photovoltaic cell assembly according to claim 2, wherein the top collection structure comprises at least one bus line.

4. The photovoltaic cell assembly according to claim 1, wherein at least a portion of a peripheral edge portion of the cells include a non-conductive layer portion.

5. The photovoltaic cell assembly according to claim 4, wherein the non-conductive layer portion comprises either a liquid dielectric that is cured via UV radiation or a non-conductive tape.

6. The photovoltaic cell assembly according to claim 1, wherein the conductive foil is an electrically conductive adhesive tape.

7. The photovoltaic cell assembly according to claim 1, wherein the conductive foil is a foil tape with an embossed surface and wherein at least 10% of a surface area of the embossed surface is in direct contact with the cell.

8. The photovoltaic cell assembly according to claim 1, wherein the adhesive is a conductive adhesive.

9. The photovoltaic cell assembly according to claim 1, wherein the adhesive is a non-conductive adhesive.

10. The photovoltaic cell assembly according to claim 1, wherein an overlap of the conductive foil on the conductive substrate layer is at least 2.0 mm in length.

11. The photovoltaic cell assembly according to claim 3, wherein an overlap of the conductive foil overlaps at least about 10% of an area of the bus line.

12. The photovoltaic cell assembly according to claim 1, wherein the conductive foil includes a plurality of folds.

13. The photovoltaic cell assembly of claim 3, wherein the at least one bus line is located within 10 mm of a peripheral edge of the cell at the trailing edge.

14. The photovoltaic cell assembly of claim 3, wherein the conductive foil contacts at least a portion of the bus line of the collection structure.

15. The photovoltaic cell assembly of claim 1, wherein the conductive element is a metal foil with an embossed surface;
wherein at least 40 percent of a surface area of the embossed surface of the metal foil is in direct contact with the top collection structure or top surface of the first photovoltaic cell and at least 40 percent of a surface area of the embossed surface of the metal foil is in direct contact with the opposing conductive substrate layer of an adjacent second photovoltaic cell.

16. The photovoltaic cell assembly of claim 1, wherein the angle of the fold is 0 and the conductive element is folded upon itself.

17. The photovoltaic cell assembly of claim 3, wherein the conductive element is a metal foil with an embossed surface;
wherein at least 10 percent of a surface area of the embossed surface of the metal foil is in direct contact with the top collection structure or top surface of the first photovoltaic cell and at least 10 percent of a surface area of the embossed surface of the metal foil is in direct contact with the opposing conductive substrate layer of an adjacent second photovoltaic cell.

18. The photovoltaic cell assembly of claim 17, wherein the angle of the fold is 0 and the conductive element is folded upon itself.

19. The photovoltaic cell assembly of claim 17, wherein the fold separates a first half and a second half of the conductive foil and the first half and second half are separated by the angle from 0° to 45°.

* * * * *